United States Patent
Lavanga et al.

(10) Patent No.: US 12,230,700 B2
(45) Date of Patent: Feb. 18, 2025

(54) TYPE III-V SEMICONDUCTOR DEVICE WITH STRUCTURED PASSIVATION

(71) Applicant: Infineon Technologies Austria AG, Villach (AT)

(72) Inventors: Simone Lavanga, Villach (AT); Nicholas Dellas, Villach (AT); Gerhard Prechtl, Rosegg (AT); Luca Sayadi, Villach (AT)

(73) Assignee: Infineon Technologies Austria AG, Villach (AT)

( * ) Notice: Subject to any disclaimer, the term of this patent is extended or adjusted under 35 U.S.C. 154(b) by 410 days.

(21) Appl. No.: 17/667,927

(22) Filed: Feb. 9, 2022

(65) Prior Publication Data

US 2023/0253486 A1     Aug. 10, 2023

(51) Int. Cl.
*H01L 29/778* (2006.01)
*H01L 21/02* (2006.01)
(Continued)

(52) U.S. Cl.
CPC .... *H01L 29/7786* (2013.01); *H01L 21/02178* (2013.01); *H01L 21/0228* (2013.01); *H01L 21/7605* (2013.01); *H01L 21/765* (2013.01); *H01L 23/291* (2013.01); *H01L 23/3171* (2013.01); *H01L 29/2003* (2013.01);
(Continued)

(58) Field of Classification Search
None
See application file for complete search history.

(56) References Cited

U.S. PATENT DOCUMENTS 10,096,702 B2 * 10/2018 Beach ............... H01L 29/7787
11,121,245 B2    9/2021 Cao et al.
(Continued)

FOREIGN PATENT DOCUMENTS

| CN | 105448960 A | * | 3/2016 | ......... H01L 29/0657 |
| EP | 2120266 A1 | * | 11/2009 | ......... H01L 29/0843 |
| GB | 2248966 A | * | 4/1992 | ......... H01L 29/1075 |

OTHER PUBLICATIONS

Hung, Ting-Hsiang, et al., "Interface charge engineering at atomic layer deposited dielectric/III-nitride interfaces", Applied Physics Letters 102, Feb. 22, 2013, 1-5.

*Primary Examiner* — Michael Lebentritt
(74) *Attorney, Agent, or Firm* — Murphy, Bilak & Homiller, PLLC

(57) ABSTRACT

A high-electron-mobility transistor comprises a semiconductor body comprising a barrier region and a channel region that forms a heterojunction with the barrier region such that a two-dimensional charge carrier gas channel is disposed in the channel region, source and drain electrodes disposed on the semiconductor body and laterally spaced apart from one another, a gate structure disposed on the semiconductor body and laterally between the source and drain electrodes, the gate structure being configured to control a conduction state of two-dimensional charge carrier gas, and a first dielectric region that is disposed along the upper surface of the semiconductor body in a lateral region that is between the gate structure and the drain electrode, wherein the first dielectric region comprises aluminum and oxide, and wherein first dielectric region comprises a first end that faces and is laterally spaced apart from the gate structure.

12 Claims, 5 Drawing Sheets

(51) Int. Cl.
  *H01L 21/76*      (2006.01)
  *H01L 21/765*     (2006.01)
  *H01L 23/29*      (2006.01)
  *H01L 23/31*      (2006.01)
  *H01L 29/20*      (2006.01)
  *H01L 29/205*     (2006.01)
  *H01L 29/40*      (2006.01)
  *H01L 29/66*      (2006.01)

(52) U.S. Cl.
  CPC .......... *H01L 29/205* (2013.01); *H01L 29/404* (2013.01); *H01L 29/66462* (2013.01)

(56) References Cited

U.S. PATENT DOCUMENTS

2012/0217544 A1    8/2012    Ohki
2017/0352754 A1   12/2017   Beach et al.
2020/0221969 A1*  7/2020    Ram ........................ H01L 31/08
2020/0335617 A1   10/2020   Banerjee et al.
2023/0067452 A1*  3/2023    Reiser ................... H01L 29/205

* cited by examiner

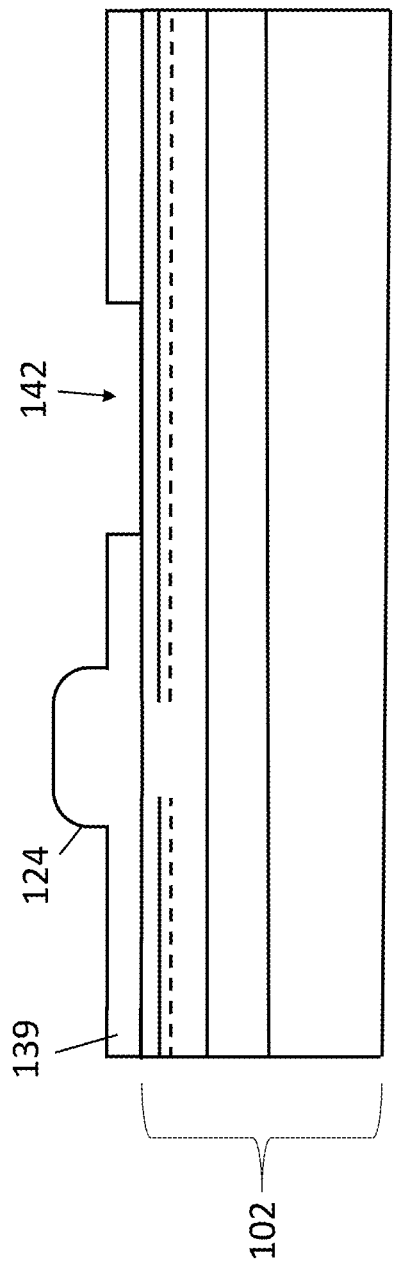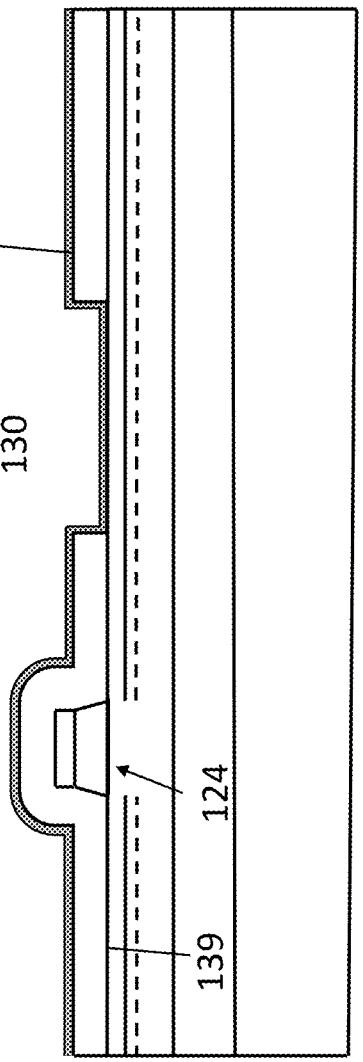
Fig. 3A
Fig. 3B
FIGURE 3

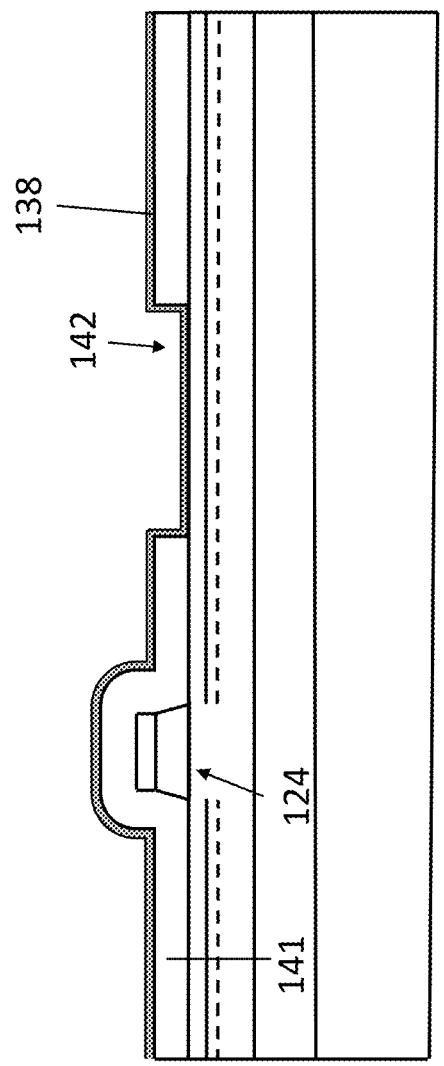
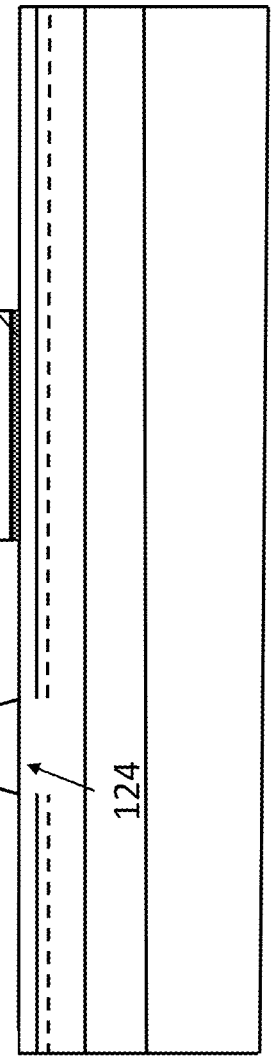
Fig. 4A
Fig. 4B
FIGURE 4

TYPE III-V SEMICONDUCTOR DEVICE WITH STRUCTURED PASSIVATION

TECHNICAL FIELD

The instant application relates to semiconductor devices, and particularly relates to high-electron-mobility transistor devices that are formed in type III-V semiconductor technology.

BACKGROUND

Semiconductor transistors, in particular field-effect controlled switching devices such as a MISFET (Metal Insulator Semiconductor Field Effect Transistor), in the following also referred to as MOSFET (Metal Oxide Semiconductor Field Effect Transistor) and an HEMT (high-electron-mobility Field Effect Transistor) also known as heterostructure FET (HFET) and modulation-doped FET (MODFET) are used in a variety of applications. An HEMT is formed from type III-V semiconductor material, e.g., gallium nitride (GaN), gallium arsenide (GaAs), etc. An HEMT includes a two-dimensional charge carrier gas that is created by a heterojunction between two layers of type III-V semiconductor material having different band gaps. The two-dimensional charge carrier gas can be a two-dimensional electron gas (2DEG) or a two-dimensional hole gas (2DHG). This two-dimensional charge carrier gas provides the active device channel that accommodates the load current of the device. Due to the high mobility of carriers within the two-dimensional charge carrier gas, these devices offer very low on-resistance in comparison to other device technologies. For this reason, HEMTs are well suited for power switching applications, i.e., applications requiring the control of voltages in excess of 250V, 500V, 1000V, etc. or greater, and/or the control of current in excess of 1 A, 5 A, 10 A, etc.

An important device parameter in power switching applications is the dynamic $R_{DSON}$ (on-state resistance) of the switching device. A lower dynamic $R_{DSON}$ can significantly improve power dissipation in both hard switching applications and soft switching applications. Current approaches to maintaining a low dynamic $R_{DSON}$ involve making unfavorable trade-offs with static device parameters such as $V_{th}$ (threshold voltage) and $I_{GSS}$ (gate-source leakage current).

SUMMARY

A high-electron-mobility transistor is disclosed. According to an embodiment, the high-electron-mobility transistor comprises a semiconductor body comprising a barrier region of type III-V semiconductor material and a channel region of type III-V semiconductor material that forms a heterojunction with the barrier region such that a two-dimensional charge carrier gas channel is disposed in the channel region near the heterojunction, source and drain electrodes disposed on the semiconductor body and laterally spaced apart from one another, each of the source and drain electrodes being in low-ohmic contact with the two-dimensional charge carrier gas channel, a gate structure disposed on the semiconductor body and laterally between the source and drain electrodes, the gate structure being configured to control a conduction state of two-dimensional charge carrier gas between the source and drain electrodes, and a first dielectric region that is disposed along the upper surface of the semiconductor body in a lateral region that is between the gate structure and the drain electrode, wherein the first dielectric region comprises aluminum and oxide, and wherein first dielectric region comprises a first end that faces and is laterally spaced apart from the gate structure.

According to another embodiment, the high-electron-mobility transistor comprises a semiconductor body comprising a barrier region of type III-V semiconductor material and a channel region of type III-V semiconductor material that forms a heterojunction with the barrier region such that a two-dimensional charge carrier gas channel is disposed in the channel region near the heterojunction, source and drain electrodes disposed on the semiconductor body and laterally spaced apart from one another, each of the source and drain electrodes being in low-ohmic contact with the two-dimensional charge carrier gas channel, a gate structure disposed on the semiconductor body and laterally between the source and drain electrodes, the gate structure being configured to control a conduction state of two-dimensional charge carrier gas between the source and drain electrodes, and first and second passivation regions disposed on the semiconductor body, wherein the first and second passivation regions are arranged to influence the two-dimensional charge carrier gas such that a density of the two-dimensional charge carrier gas channel underneath an interface between the first passivation region and the semiconductor body is higher than underneath an interface between the second passivation region and the semiconductor body.

A method of forming a high-electron-mobility transistor is disclosed. According to an embodiment, the method comprises providing a semiconductor body comprising a barrier region of type III-V semiconductor material and a channel region of type III-V semiconductor material that forms a heterojunction with the barrier region such that a two-dimensional charge carrier gas channel is disposed in the channel region near the heterojunction, forming source and drain electrodes that are disposed on the semiconductor body and laterally spaced apart from one another, each of the source and drain electrodes being in low-ohmic contact with the two-dimensional charge carrier gas channel, forming a gate structure that is disposed on the semiconductor body laterally between the source and drain electrodes, the gate electrode being configured to control a conduction state of two-dimensional charge carrier gas between the source and drain electrodes, and forming a first dielectric region that is disposed along the upper surface of the semiconductor body in a lateral region that is between the gate structure and the drain electrode, wherein the first dielectric region comprises aluminum and oxide, and wherein first dielectric region comprises a first end that faces and is laterally spaced apart from the gate structure.

Those skilled in the art will recognize additional features and advantages upon reading the following detailed description, and upon viewing the accompanying drawings.

BRIEF DESCRIPTION OF THE DRAWINGS

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

FIGS. 2A and 2B, illustrates a method of forming the high-electron-mobility transistor to comprise the structured passivation layer in the drain region of the device, according to an embodiment.

FIG. 3, which includes FIGS. 3A and 3B, illustrates a method of forming the high-electron-mobility transistor to comprise the structured passivation layer in the drain region of the device, according to another embodiment.

FIG. 4, which includes FIGS. 4A and 4B, illustrates a method of forming the high-electron-mobility transistor to comprise the structured passivation layer in the drain region of the device, according to another embodiment.

FIGS. 5A, 5B, and 5C, illustrates configurations of a structured passivation layer and field plate for a high-electron-mobility transistor, according to different embodiments.

DETAILED DESCRIPTION

Embodiments of a high-electron-mobility transistor with passivation regions that are compositionally tailored and geometrically structured and provide a favorable improvement to RDSON relative to Vth and $I_{GSS}$. The passivation regions comprise a first dielectric region that interfaces with the barrier region between the gate structure and drain electrode, i.e., over the drift region of the device. The first dielectric region is structured to have a first end that is laterally spaced apart from the gate structure of the device. The passivation regions additionally comprise a second dielectric region that covers the gate structure and fills the lateral region between the gate structure and the first dielectric region. The first and second dielectric regions have different material compositions from one another. This difference is utilized to modulate the density of the two-dimensional charge carrier gas channel. In this way, the sheet resistance of the two-dimensional charge carrier gas channel can be lowered in the drain region of the device without detrimentally impacting electric fields in the vicinity of the gate structure, and without increasing the gate-to-drain capacitance ($C_{gd}$) and charge ($Q_{gd}$).

Figure 1:
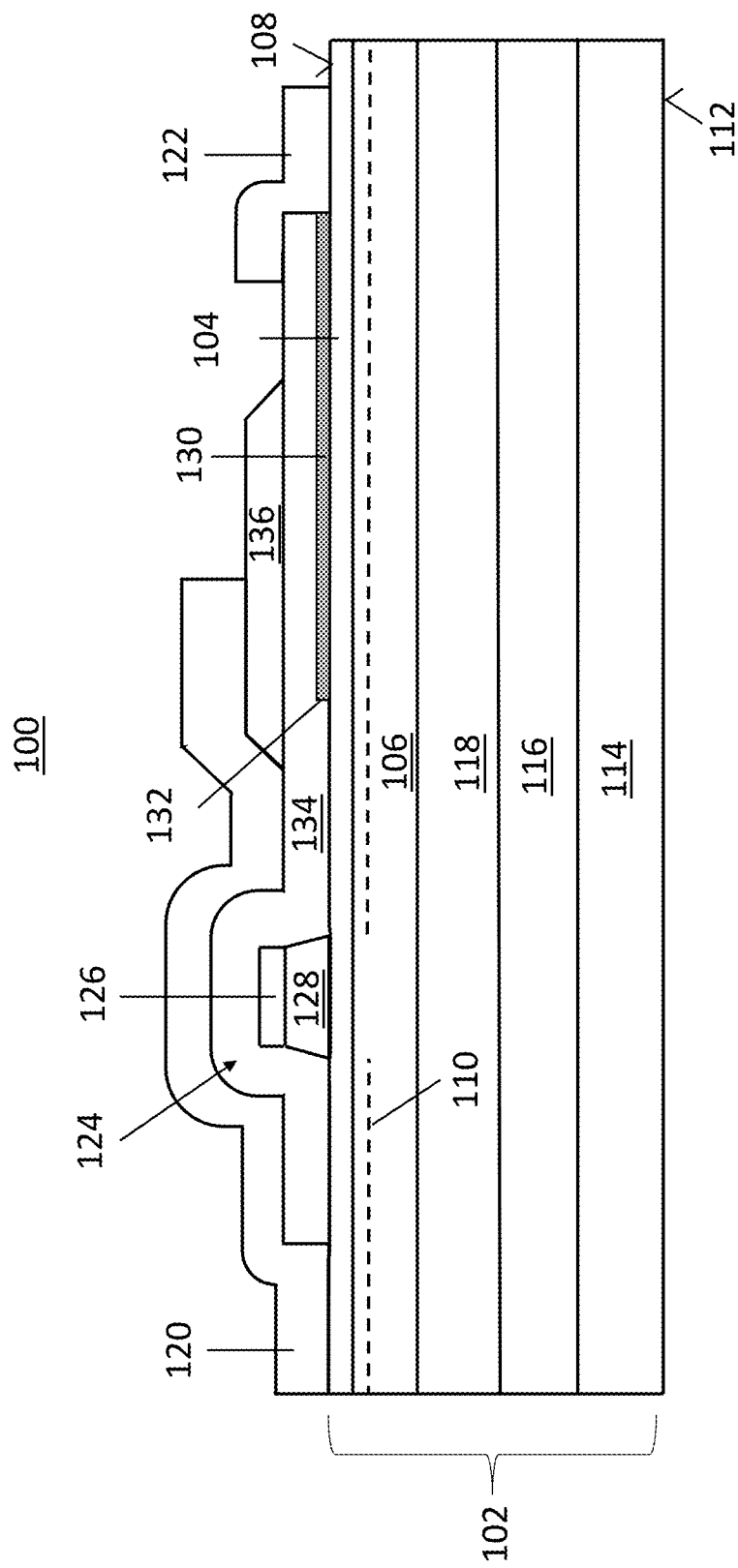
FIG. 1 illustrates a high-electron-mobility transistor with a with structured passivation layer in the drain region of the device, according to an embodiment.

Referring to FIG. 1, a high-electron mobility transistor 100 is formed in a semiconductor body 102. The semiconductor body 102 comprises a barrier region 104 and a channel region 106. The barrier region 104 extends to an upper surface 108 of the semiconductor body 102 and the channel region 106 is disposed below the barrier region 104. The barrier region 104 and the channel region 106 are regions of type III-V semiconductor material which have a different bandgap from one other so as to form a heterojunction at the interface between these regions. According to an embodiment, the channel region 106 is a region of GaN or AlGaN and the barrier region 104 is a region of AlGaN with a higher aluminum content as the channel region 106. A two-dimensional charge carrier gas channel 110 is disposed in the channel region 106 near the heterojunction. The two-dimensional charge carrier gas channel 110 may be a 2DEG, e.g., in the above-described embodiment wherein the channel region 106 is a region of GaN or AlGaN and the barrier region 104 is a region of AlGaN with a higher aluminum content as the channel region 106.

The semiconductor body 102 additionally comprises a lower region that is disposed below the barrier and channel regions 104, 106 and extends to a rear surface 112 of the semiconductor body 102. The lower region can include regions of type IV semiconductor material (e.g., Silicon, Silicon Carbide), regions of type III-V semiconductor material (e.g., GaN and AlGaN) and other regions of type III-V material (e.g., AlN). For example, the lower region may comprise a base substrate 114 of silicon that extends to the rear surface 112 of the semiconductor substrate, a thin (e.g., 100-200 nm thick) nucleation layer (not shown) of AlN that is disposed on the base substrate 114 and is used to epitaxially grow type III-V semiconductor material thereon, and a lattice transition region 116 disposed on the nucleation layer. The lattice transition region 116 may comprise multiple layers of type III-V nitride material with varying crystalline properties e.g., layers of GaN/AlGaN/AlN. These layers are configured to alleviate lattice mismatch between the material of the base substrate 114 and the superjacent type III-V material, thus facilitating the epitaxial growth of substantially defect free type III-V material. The semiconductor body 102 may additionally comprise a back-barrier region 118 disposed on the lattice transition region 116 and/or directly underneath the channel region 106. The back-barrier region 118 can be a compound region of type III-V semiconductor material, e.g., a region of AlGaN with a constant aluminum concentration, which may be provided to increase carrier confinement in the two-dimensional charge carrier gas channel 110.

The high-electron mobility transistor 100 comprises source and drain electrodes 120, 122 that are disposed on the semiconductor body 102 and are laterally spaced apart from one another. The source and drain electrodes 120, 122 are formed from an electrically conducting material, e.g., titanium (Ti), aluminum (Al), etc. The source and drain electrodes 120, 122 are each in ohmic contact with the two-dimensional charge carrier gas channel 110. This ohmic contact may be realized by through provision of conductive contacts in the semiconductor body 102 and/or trench structures (not shown).

The high-electron mobility transistor 100 additionally comprises a gate structure 124 disposed on the semiconductor body 102 that is laterally between the source and drain electrodes 120, 122. The gate structure 124 comprises a gate electrode 126 that is formed from an electrically conductive material, e.g., titanium nitride (TiN), titanium (Ti), tungsten (W), etc. According to an embodiment, the gate structure 124 additionally comprises a doped region 128 of type III-V semiconductor material arranged between the gate electrode 126 and the barrier region 108. The doped region 128 may be a region of p-type GaN, for example.

The working principle of the high-electron mobility transistor 100 is as follows. The two-dimensional charge carrier gas channel 110 is the active channel of the device. The gate structure 124 is configured to control a conduction state of two-dimensional charge carrier gas channel 110 between the source and drain electrodes 120, 122. In an on-state of the device, the source and drain electrodes 120, 122 are electrically connected to one another via the two-dimensional charge carrier gas channel 110. In the off-state of the device, the two-dimensional charge carrier gas channel 110 is locally disrupted underneath the gate structure 124 so that the source and drain electrodes 120, 122 are electrically disconnected from one another, i.e., able to maintain an electrical potential difference. The device is transitioned between the on-state and the off-state by the application of a gate potential to the gate electrode 126. The gate potential influences an electric field beneath the gate, which in turn controls whether the two-dimensional charge carrier gas channel 110 is depleted of carriers. According to an embodiment, the high-electron mobility transistor 100 is a normally-off device, meaning that the device is in off-state with zero applied voltage to the gate electrode 126. A normally-off configuration can be obtained if the doped region 128 of type III-V semiconductor material is doped to sufficiently deplete the two-dimensional charge carrier gas without any bias applied to the gate electrode 126.

The high-electron-mobility transistor comprises a first dielectric region 130. The first dielectric region 130 is disposed along the upper surface 108 of the semiconductor body 102 and thus may form a direct interface with the barrier region 104. The first dielectric region 130 is disposed in a lateral region of the high-electron-mobility transistor that is between the gate structure 124 and the drain electrode 122. The first dielectric region 130 may be structured to comprise a first end 132 that faces and is laterally spaced apart from the gate structure 124. That is, the first dielectric region 130 may be structured to be laterally spaced apart from the gate structure 124, with a lateral section of the of the semiconductor body 102 that is uncovered from the first dielectric region 130 and/or does not directly interface with the first dielectric region 130. As shown, the first dielectric region 130 may extend to completely reach the drain electrode 122. In other embodiments, the first dielectric region 130 may be laterally spaced apart from the drain electrode 122.

The high-electron-mobility transistor comprises a second dielectric region 134. The second dielectric region 134 covers the gate structure 124. Moreover, the second dielectric region 134 may be disposed along the upper surface 108 of the semiconductor body in a lateral region of the high-electron-mobility transistor that is between the gate structure 124 and the first end 132 of the first dielectric region 130. As shown, the second dielectric region 134 may also be disposed along the upper surface 108 of the semiconductor body in a lateral region of the high-electron-mobility transistor that is between the gate structure 124 and the source electrode 120. The second dielectric region 134 can be a single layer of dielectric material or can be a combination of multiple layers of dielectric material.

The first and second dielectric regions 130, 134 respectively form the passivation regions of the device, namely a first passivation region and a second passivation region. The term passivation region refers to structures or layers of material that protect and/or provide electrical isolation for the semiconductor body 102 and elements formed therein. Thus, the first and second dielectric regions 130, 134 are collectively arranged as first and second passivation regions that protect the gate structure 124 and the upper surface 108 of the semiconductor body 102 between the source and drain electrodes 120, 122.

According to an embodiment, the high-electron mobility transistor 100 further comprises a field plate 136. The field plate 136 is formed from an electrically conductive material, e.g., tungsten, aluminum, highly doped polycrystalline or monocrystalline semiconductor, etc. The field plate 136 is disposed over the semiconductor body 102 in a region that is laterally between the gate structure 124 and the drain electrode 122. Moreover, first dielectric region 130 and second dielectric region 134 are each disposed underneath the conductive field plate 136. That is, the field plate 136 is isolated from the upper surface 108 of the semiconductor body 102 by the first and second dielectric regions 130, 134. As shown, a continuous structure that forms the source electrode 132 laterally extends over the gate region and contacts the field plate 136, thus setting the field plate 136 at source potential. More generally, the field plate 136 may be connected to a device node, such as a gate or source terminal, in any different way. The field plate 136 improves the breakdown voltage of the first high-electron mobility transistor 100 112 by providing compensatory electric fields in a drift region of the device.

According to an embodiment, the first and second dielectric regions 130, 134 have different material compositions from one another. These material compositions may be selected to modulate a density of the two-dimensional charge carrier gas channel 110 in different lateral regions of the high-electron-mobility transistor. In more detail, the material composition of the first dielectric region 130 may be selected to increase carrier density of the two-dimensional charge carrier gas channel 110 in a drift region of the device underneath the interface between the first dielectric region 130 and the barrier region 104. The carrier density of the two-dimensional charge carrier gas channel 110 can be increased by selecting a material for the first dielectric region 130 so as to provide a low density of interface and border trap states and a large conduction band offset between the first dielectric region 130 and the barrier region 104. These properties minimize hot carrier injection from the two-dimensional charge carrier gas channel 110 into interface and border trap states at the interface between the barrier region 104 and the first dielectric region 132, thereby maintaining a high density in the two-dimensional charge carrier gas channel 110 over time Although this technique can be used to improve the RDSON by lowering the sheet resistance of the two-dimensional charge carrier gas channel 110, if this technique is employed throughout the complete area of the device including the gate region, certain drawbacks are observed. In particular, the increased carrier density of the two-dimensional charge carrier gas channel 110 increases electric fields in the vicinity of the gate structure 124 and the field plate 136. Separately or in combination, the materials that enhance the density of the two-dimensional charge carrier gas channel 110 may increase gate leakage if in direct contact with the gate structure 124. These effects detract from the static parameters of the device such as $V_{th}$ and $I_{GSS}$. Accordingly, the material composition of the second dielectric region 134 is selected to produce a relatively lower density of the two-dimensional charge carrier gas channel 110 in the gate region than in the drift region. In this context, the gate region refers to the lateral region of the device that is directly underneath the gate structure 124 and a lateral region disposed on either side of the gate structure 124.

The density of the two-dimensional charge carrier gas channel 110 can be modulated by differing the material composition of the first and second dielectric regions 130, 134 in the following way. According to an embodiment, the first dielectric region 130 is an electrical insulator comprising aluminum and oxide. Examples of these dielectric materials include aluminum oxynitrides $((AlN)_X \cdot (Al_2O_3)_{1-X})$. In one particular example, the first dielectric region 130 is a layer of $AlO_x$ such as aluminum oxide ($Al_2O_3$).

According to an embodiment, the second dielectric region 134 comprises a silicon-based insulator. Examples of these silicon-based insulator materials include silicon oxides (SiOx), silicon nitrides (SiNx), and silicon oxynitrides ($Si-O_xN_y$), e.g., $SiO_2$, $Si_3N_4$, etc. These materials compare favorably to the above-discussed material for the first dielectric region 130 with respect to the performance of the gate structure 124.

According to the depicted embodiment, the first end 132 of the first dielectric region 130 is laterally spaced apart from the gate structure 124 by a greater distance than a first edge side of the conductive field plate 136, wherein the first edge side of the conductive field plate 136 corresponds to an edge side of the conductive field plate 136 that is laterally closest to the gate structure 124. Stated another way, the first dielectric region 130 is structured to be laterally spaced apart from a gate facing end of the conductive field plate 136 such that the first dielectric region 130 does not overlap with any corner formed by a gate facing end surface of the conductive field plate 136. This arrangement brings the first dielectric region 130 away from the end corners of the conductive field plate 136 and therefore minimizes the electric field impact of enhancing the density of the two-dimensional charge carrier gas channel 110.

Figure 2:
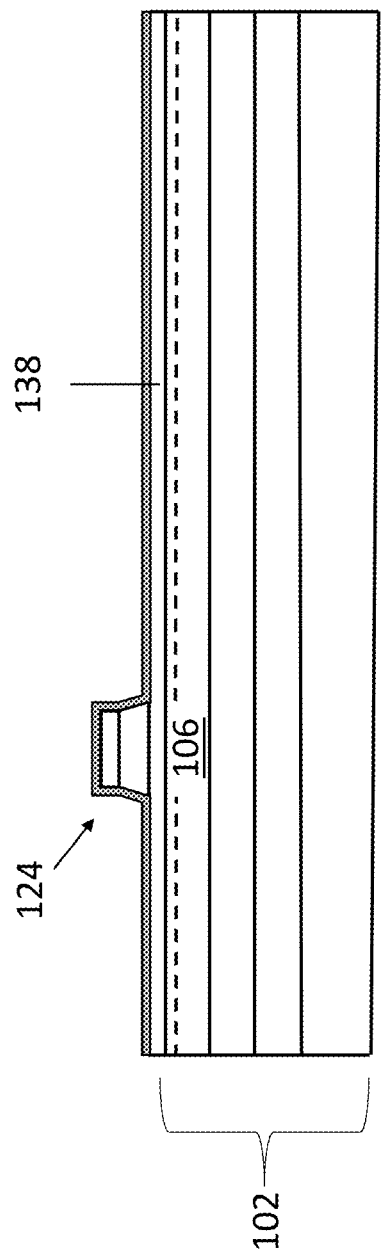
FIG. 2, which includes
Figure 2:
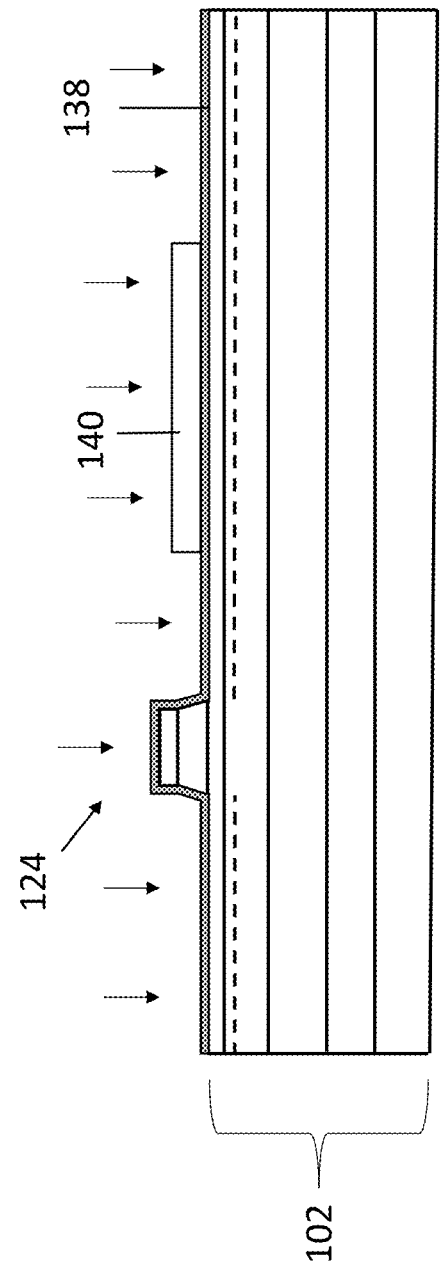

Referring to FIG. 2, selected method steps for forming the high-electron mobility transistor 100 are shown, according to an embodiment. The semiconductor body 102 may be formed by initially providing a base substrate and performing a sequence of epitaxial deposition steps. Subsequently, the gate structure 124 may be formed on the semiconductor body 102 by a sequence of deposition and etching steps, for example.

As shown FIG. 2A, a layer 138 of first dielectric material is formed on the semiconductor body 102. The first dielectric material which forms the layer 138 corresponds to the above-discussed materials for the first dielectric region 130. The layer 138 is initially conformally deposited to cover the gate structure 124 and the upper surface 108 of the semiconductor body 102 adjacent the gate structure 124. A thickness of the layer 138 of first dielectric material can be in the range of 1.0-5.0 nm (nanometers) and more particularly in the range of 1.5-3.5 nm.

According to an embodiment, the layer 138 of first dielectric material is formed by an atomic layer deposition (ALD) technique. The atomic layer deposition technique can be performed at low temperatures, e.g., in the range of 150° C.-450° C. Such a low temperature ALD technique minimizes damage to the surface of the semiconductor body 102 and mitigates deactivation of dopant atoms in the gate structure 124. As a result, the above-discussed beneficial properties at the interface between the first dielectric region 130 and the semiconductor body 102 are obtained.

As shown FIG. 2B, a structuring process is performed to remove the layer 138 of first dielectric material from the gate structure 124 and lateral regions on either side of the gate structure 124. This structuring process forms the first dielectric region 130 with the first end 132 of the first dielectric region 130 being laterally spaced apart from the gate structure 124 as shown in FIG. 1. The structuring process may comprise a masked etching process wherein a mask 140 is provided over the layer 138 of first dielectric material in the desired geometry of the first dielectric region 130. The mask 140 can be a hardmask, e.g., an oxide, that is patterned using photolithography techniques. With the mask 140 in place, an etching process is performed to remove the layer 138 of first dielectric material from regions that are uncovered from the mask 140. This etching process may be a wet chemical etch, for example. Subsequently, the second dielectric region 134 may be formed, e.g., by depositing one or more layers of second dielectric material on the device comprising the structured first dielectric region 130.

Referring to FIG. 3, an alternate technique for obtaining a device having the first and second dielectric regions 130, 134 with the desired geometry is shown. As shown in FIG. 3A, a layer 139 of second dielectric material is initially conformally deposited to cover the gate structure 124 and the complete upper surface 108 of the semiconductor body 102 at locations adjacent the gate electrode 126. The second dielectric material which forms the layer 139 corresponds to the above-discussed materials for the second dielectric region 134. A thickness of the layer 139 of second dielectric material can generally be in the range of 20 nm-1 μm. After the deposition, the layer 139 of second dielectric material is structured to form an opening 142 that exposes the upper surface 108 of the semiconductor body 102 in the lateral region that is between the gate structure 124 and the drain electrode 122.

As shown in FIG. 3B a layer 138 of first dielectric material is conformally deposited such that the first dielectric material directly interfaces with the semiconductor body 102 in the opening 142 and covers the layer 139 of second dielectric material outside of the opening 142. This may be done by depositing the layer 138 of first dielectric material using a low-temperature ALD technique as described above. Subsequently, a further layer of dielectric material (not shown) may be deposited to cover the layer 138 of first dielectric material. This further layer of dielectric material can comprise the above-discussed materials for the second dielectric region 134. Subsequently, a conductive metal layer can be deposited on this further layer of dielectric material and subsequently structured. This conductive metal layer can be used to form the field plate 136 or a structure which electrically connects to the field plate 136, as will be illustrated below with reference to FIG. 5.

Referring to FIG. 4, an alternate technique for obtaining a device having the first and second dielectric regions 130, 134 with the desired geometry is shown. As shown in FIG. 4A, a sacrificial layer 141 is initially conformally deposited to cover the gate structure 124. The sacrificial layer 141 can comprise an etchable material such as TEOS, $SiO_x$, SiN, etc. The sacrificial layer 141 is then structured to form an opening 142 in a similar manner as described above. Subsequently, a layer 138 of first dielectric material is conformally deposited to directly interface with the semiconductor body 102 in the opening 142.

As shown in FIG. 4B, the sacrificial layer 141 along with the layer 138 of first dielectric material outside is removed at locations outside of the desired location for the first dielectric region 130. This is done by filling the opening 142 with an etch resist 143 that protects the layer 138 of first dielectric material underneath the resist and performing an etching process. Subsequently, the second dielectric region 134 may be formed, e.g., by depositing one or more layers of second dielectric material on the device comprising the structured first dielectric region 130.

Figure 5:
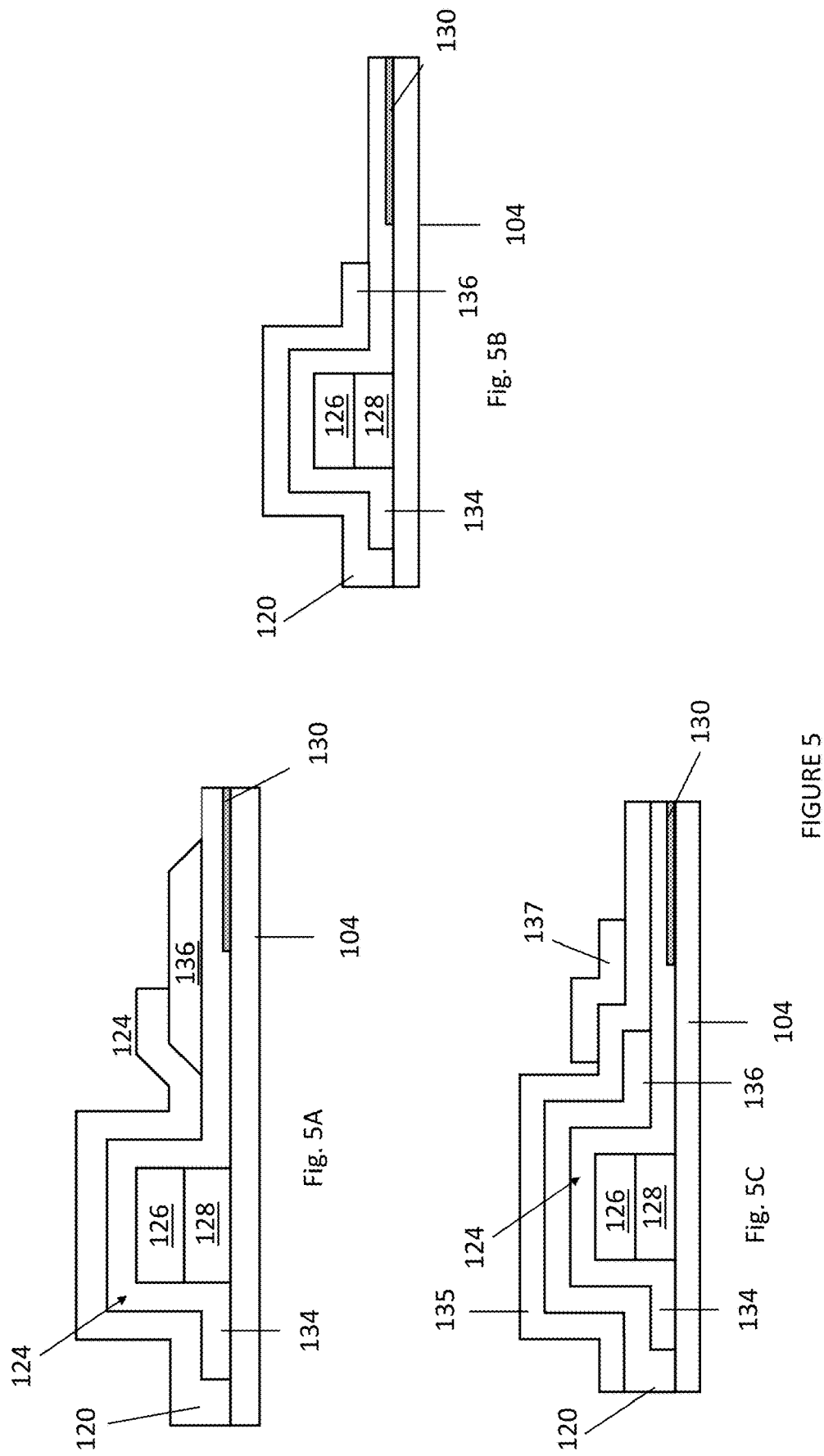
FIG. 5, which includes

Referring to FIG. 5, various field plate configurations are shown for the high-electron mobility transistor 100. The embodiment of FIG. 5A resembles that depicted in FIG. 1, wherein the field plate 136 is a conductive structure (e.g., metal) that is formed directly on the second dielectric region 134 and is in contact with a continuous conductive structure that wraps over the gate structure 124 and provides the source contact 120. As shown, the field plate 136 may comprise end surfaces that are tilted, i.e., disposed at a non-orthogonal angle, relative to the surface of the second dielectric region 134. The embodiment of FIG. 5B differs from that of FIG. 5B in that the field plate 136 does not comprise the tilted end surfaces. In this embodiment, the field plate 136 corresponds to a part of the same continuous conductive structure that wraps over the gate region and provides the source contact 120. One advantage of this configuration is less processing complexity. The embodiment of FIG. 5C additionally comprises a second field plate 137 which has a similar composition and performs a similar function as the previously discussed field plate 136. The second field plate 137 is provided by forming a third dielectric region 135 that covers the gate structure 124 and the second dielectric region 124. The second field plate 137 may be formed on top of the third dielectric region 135 in a drain region of the device.

The HEMT device concept disclosed herein represents just one potential device that may utilize a multi-material passivation structure to obtain the advantageous performance characteristics described herein. The concept may be more generally applied to a wide variety of HEMT device configurations. Examples of these HEMT device configurations include trenched-gate configurations (i.e., devices wherein the gate structure 124 is disposed within a trench that locally reduces a thickness of the barrier layer), normally-on configurations, device configurations without a field plate 136, device configurations utilizing other types of type III-V material, e.g., gallium arsenide (GaAs), indium nitride (InN), and so forth.

Although the present disclosure is not so limited, the following numbered examples demonstrate one or more aspects of the disclosure.

Example 1. A high-electron-mobility transistor, comprising: a semiconductor body comprising a barrier region of type III-V semiconductor material and a channel region of type III-V semiconductor material that forms a heterojunction with the barrier region such that a two-dimensional charge carrier gas channel is disposed in the channel region near the heterojunction; source and drain electrodes disposed on the semiconductor body and laterally spaced apart from one another, each of the source and drain electrodes being in low-ohmic contact with the two-dimensional charge carrier gas channel; a gate structure disposed on the semiconductor body and laterally between the source and drain electrodes, the gate structure being configured to control a conduction state of two-dimensional charge carrier gas between the source and drain electrodes; and a first dielectric region that is disposed along the upper surface of the semiconductor body in a lateral region that is between the gate structure and the drain electrode, wherein the first dielectric region comprises aluminum and oxide, and wherein first dielectric region comprises a first end that faces and is laterally spaced apart from the gate structure.

Example 2. The high-electron-mobility transistor of example 1, further comprising a second dielectric region that covers the gate structure, wherein the second dielectric region has a different material composition as the first dielectric region.

Example 3. The high-electron-mobility transistor of example 2, wherein the second dielectric region comprises a span that is disposed along the upper surface of the semiconductor body in a lateral region that is between the gate structure and the first end of the first dielectric region.

Example 4. The high-electron-mobility transistor of example 2, wherein the first dielectric region is a layer of $AlO_x$.

Example 5. The high-electron-mobility transistor of example 4, wherein the second dielectric region comprises any one or more of: $SiO_x$, $SiN_x$ or $SiO_xN_y$.

Example 6. The high-electron-mobility transistor of example 4, wherein the channel region is a region of GaN or AlGaN, and wherein the barrier region is a region of AlGaN with a higher aluminum content than the channel region.

Example 7. The high-electron-mobility transistor of example 2, further comprising a conductive field plate that is disposed over the semiconductor body in a region that is laterally between the between the gate structure and the drain electrode Example 8. The high-electron-mobility transistor of example 7, wherein the conductive field plate comprises a first edge side that is laterally closest to the gate structure, and wherein the first edge side of the conductive field plate is laterally closer to the gate structure than the first end of the first dielectric region.

Example 9. The high-electron-mobility transistor of example 7, further comprising a second conductive field plate that is disposed over the semiconductor body in a region that is laterally between the between the gate structure and the drain electrode, wherein the second conductive field plate is disposed on a third dielectric region that is formed on the field plate.

Example 10. A high-electron-mobility transistor, comprising: a semiconductor body comprising a barrier region of type III-V semiconductor material and a channel region of type III-V semiconductor material that forms a heterojunction with the barrier region such that a two-dimensional charge carrier gas channel is disposed in the channel region near the heterojunction; source and drain electrodes disposed on the semiconductor body and laterally spaced apart from one another, each of the source and drain electrodes being in low-ohmic contact with the two-dimensional charge carrier gas channel; a gate structure disposed on the semiconductor body and laterally between the source and drain electrodes, the gate electrode being configured to control a conduction state of two-dimensional charge carrier gas between the source and drain electrodes; and first and second passivation regions disposed on the semiconductor body, wherein the first and second passivation regions are arranged to influence the two-dimensional charge carrier gas such that a density of the two-dimensional charge carrier gas underneath an interface between the first passivation region and the semiconductor body is higher than underneath an interface between the second passivation region and the semiconductor body.

Example 11. The high-electron-mobility transistor of example 10, wherein the first passivation region comprises a first dielectric material, wherein the second passivation region comprises a second dielectric material, wherein the first dielectric material comprises aluminum and oxide, and wherein the second dielectric material comprises a silicon based insulator Example 12. The high-electron-mobility transistor of example 10, wherein the first passivation region comprises a layer of the first dielectric material that is disposed along the upper surface of the semiconductor body in a lateral region that is between the gate structure and the drain electrode and is spaced apart from the gate structure, and wherein the second passivation region comprises a region of the second dielectric material that is disposed along the upper surface of the semiconductor body in a lateral region that is between the gate structure and the layer of the first dielectric material.

Example 13. A method of forming a high-electron-mobility transistor, the method comprising: providing a semiconductor body comprising a barrier region of type III-V semiconductor material and a channel region of type III-V semiconductor material that forms a heterojunction with the barrier region such that a two-dimensional charge carrier gas channel is disposed in the channel region near the heterojunction; forming source and drain electrodes that are disposed on the semiconductor body and laterally spaced apart from one another, each of the source and drain electrodes being in low-ohmic contact with the two-dimensional charge carrier gas channel; forming a gate structure that is disposed on the semiconductor body laterally between the source and drain electrodes, the gate electrode being configured to control a conduction state of two-dimensional charge carrier gas between the source and drain electrodes; and forming a first dielectric region that is disposed along the upper surface of the semiconductor body in a lateral region that is between the gate structure and the drain electrode, wherein the first dielectric region comprises aluminum and oxide, and wherein first dielectric region comprises a first end that faces and is laterally spaced apart from the gate structure.

Example 14. The method of example 13, wherein forming the first dielectric region comprises depositing a layer of first dielectric material that comprises aluminum and oxide on the upper surface of the semiconductor body by an atomic layer deposition (ALD) technique.

Example 15. The method of example 14, wherein the layer of first dielectric material is initially conformally deposited to cover the gate structure, and wherein the method further comprises removing the layer of first dielectric material from the gate structure and form the first end of the first dielectric region that is laterally spaced apart from the gate structure.

Example 16. The method of example 14, further comprising: initially conformally depositing the second layer of dielectric material to cover the gate structure and cover the lateral region that is between the gate structure and the drain electrode before depositing the layer of first dielectric material; structuring the layer of second dielectric material to form an opening that exposes the upper surface of the semiconductor body in the lateral region; and depositing the layer of first dielectric material in the opening.

Example 17. The method of example 13, wherein the first dielectric region is a layer of $AlO_x$.

Example 18. The method of example 17, wherein the channel region is a region of GaN or AlGaN, and wherein the barrier region is a region of AlGaN with a higher aluminum content than the channel region.

Example 19. The method of example 13, further comprising forming a conductive field plate in the lateral region that is between the gate structure and the drain electrode, wherein the conductive field plate comprises a first edge side that is laterally closest to the gate structure, and wherein the first edge side of the conductive field plate is laterally closer to the gate structure than the first end of the first dielectric region.

In the above discussion, GaN, AlGaN and AlN are disclosed as exemplary type III-V materials that may provide the various layers of the high-electron mobility transistor 100 100. This material combination represents just one example of potential type III-V materials that can be used to provide the device concept described herein. More generally, a high-electron mobility transistor 100 according to any of the embodiments described herein can comprise any combination of binary III-V materials such as Gallium nitride (GaN), gallium arsenide (GaAs), aluminium nitride (AlN), aluminium arsenide (AlAs), indium nitride (InN), indium arsenide (InAs), etc., and ternary or quarternary type III-V semiconductor materials such as aluminium gallium nitride (AlGaN), aluminium gallium arsenide (AlGaAs), indium gallium nitride (InGaN), indium aluminium gallium nitride (InAlGaN), etc.

As used herein, the phrase "type III-V material" refers to a compound material that includes at least one Group III element, such as aluminum (Al), gallium (Ga), indium (In), and boron (B) and at least one Group V element, such as nitrogen (N), phosphorous (P), and arsenic (As), and including but not limited to any of its alloys, such as aluminum gallium nitride (AlxGa(1−x)N), indium gallium nitride (InyGa(1−y)N), aluminum indium gallium nitride (AlxInyGa(1−x−y)N), gallium arsenide phosphide nitride (GaAsaPbN(1-a-b)), and aluminum indium gallium arsenide phosphide nitride (AlxInyGa(1−x−y)AsaPbN(1-a-b)), for example. Aluminum gallium nitride and AlGaN refers to an alloy described by the formula AlxGa(1−x)N, where 0<x<1.

The term HEMT is also commonly referred to as HFET (heterostructure field effect transistor), MODFET (modulation-doped FET) and MESFET (metal semiconductor field effect transistor). The terms HEMT, HFET, MESFET and MODFET are used interchangeably herein to refer to any III-V based compound semiconductor transistor incorporating a junction between two materials with different band gaps (i.e., a heterojunction) as the channel.

Spatially relative terms such as "under," "below," "lower," "over," "upper" and the like, are used for ease of description to explain the positioning of one element relative to a second element. These terms are intended to encompass different orientations of the device in addition to different orientations than those depicted in the figures. Further, terms such as "first," "second," and the like, are also used to describe various elements, regions, sections, etc. and are also not intended to be limiting. Like terms refer to like elements throughout the description.

As used herein, the terms "having," "containing," "including," "comprising" and the like are open-ended terms that indicate the presence of stated elements or features, but do not preclude additional elements or features. The articles "a," "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A high-electron-mobility transistor, comprising:
a semiconductor body comprising a barrier region of type III-V semiconductor material and a channel region of type III-V semiconductor material that forms a heterojunction with the barrier region such that a two-dimensional charge carrier gas channel is disposed in the channel region near the heterojunction;
source and drain electrodes disposed on the semiconductor body and laterally spaced apart from one another, each of the source and drain electrodes being in low-ohmic contact with the two-dimensional charge carrier gas channel;
a gate structure disposed on the semiconductor body and laterally between the source and drain electrodes, the gate structure being configured to control a conduction state of two-dimensional charge carrier gas between the source and drain electrodes;
a first dielectric region that is disposed along the upper surface of the semiconductor body in a lateral region that is between the gate structure and the drain electrode;
a second dielectric region that covers the gate structure, wherein the second dielectric region has a different material composition as the first dielectric region;
a conductive field plate that is disposed over the semiconductor body in a region that is laterally between the between the gate structure and the drain electrode; and
a second conductive field plate that is disposed over the semiconductor body in a region that is laterally between the between the gate structure and the drain electrode, wherein the second conductive field plate is disposed on a third dielectric region that is formed on the field plate, wherein the first dielectric region comprises aluminum and oxide, wherein first dielectric region comprises a first end that faces and is laterally spaced apart from the gate structure.

2. The high-electron-mobility transistor of claim 1, wherein the second dielectric region comprises a span that is disposed along the upper surface of the semiconductor body in a lateral region that is between the gate structure and the first end of the first dielectric region.

3. The high-electron-mobility transistor of claim 1, wherein the first dielectric region is a layer of $AlO_x$.

4. The high-electron-mobility transistor of claim 3, wherein the second dielectric region comprises any one or more of: $SiO_x$, $SiN_x$ or $SiO_xN_y$.

5. The high-electron-mobility transistor of claim 3, wherein the channel region is a region of GaN or AlGaN, and wherein the barrier region is a region of AlGaN with a higher aluminum content than the channel region.

6. The high-electron-mobility transistor of claim 1, wherein the conductive field plate comprises a first edge side that is laterally closest to the gate structure, and wherein the first edge side of the conductive field plate is laterally closer to the gate structure than the first end of the first dielectric region.

7. A method of forming a high-electron-mobility transistor, the method comprising:
    providing a semiconductor body comprising a barrier region of type III-V semiconductor material and a channel region of type III-V semiconductor material that forms a heterojunction with the barrier region such that a two-dimensional charge carrier gas channel is disposed in the channel region near the heterojunction;
    forming source and drain electrodes that are disposed on the semiconductor body and laterally spaced apart from one another, each of the source and drain electrodes being in low-ohmic contact with the two-dimensional charge carrier gas channel;
    forming a gate structure that is disposed on the semiconductor body laterally between the source and drain electrodes, the gate electrode being configured to control a conduction state of two-dimensional charge carrier gas between the source and drain electrodes; and
    forming a first dielectric region that is disposed along the upper surface of the semiconductor body in a lateral region that is between the gate structure and the drain electrode,
    wherein the first dielectric region comprises aluminum and oxide, and
    wherein first dielectric region comprises a first end that faces and is laterally spaced apart from the gate structure,
    wherein forming the first dielectric region comprises:
        depositing a sacrificial layer on the gate structure and on the upper surface of the semiconductor body adjacent to the gate structure;
        forming an opening in the sacrificial layer that is laterally spaced apart from the gate structure;
        conformally depositing a layer of first dielectric material that comprises aluminum and oxide to directly interface with the semiconductor body 102 in the opening; and
        removing the sacrificial layer to as to create the first dielectric region with the first end that faces and is laterally spaced apart from the gate structure.

8. The method of claim 7, wherein the first dielectric region is a layer of $AlO_x$.

9. The method of claim 8, wherein the channel region is a region of GaN or AlGaN, and wherein the barrier region is a region of AlGaN with a higher aluminum content than the channel region.

10. The method of claim 7, further comprising forming a conductive field plate in the lateral region that is between the gate structure and the drain electrode, wherein the conductive field plate comprises a first edge side that is laterally closest to the gate structure, and wherein the first edge side of the conductive field plate is laterally closer to the gate structure than the first end of the first dielectric region.

11. The method of claim 1, wherein removing the sacrificial layer comprises filling the opening with an etch resist that protects the layer of first dielectric material underneath the resist and performing an etching process that removes the sacrificial layer outside of the etch resist.

12. A high-electron-mobility transistor, comprising:
    a semiconductor body comprising a barrier region of type III-V semiconductor material and a channel region of type III-V semiconductor material that forms a heterojunction with the barrier region such that a two-dimensional charge carrier gas channel is disposed in the channel region near the heterojunction;
    source and drain electrodes disposed on the semiconductor body and laterally spaced apart from one another, each of the source and drain electrodes being in low-ohmic contact with the two-dimensional charge carrier gas channel;
    a gate structure disposed on the semiconductor body and laterally between the source and drain electrodes, the gate structure being configured to control a conduction state of two-dimensional charge carrier gas between the source and drain electrodes; and
    a first dielectric region that is disposed along the upper surface of the semiconductor body in a lateral region that is between the gate structure and the drain electrode,
    a second dielectric region that covers the gate structure,
    a conductive field plate that is disposed over the semiconductor body in a region that is laterally between the between the gate structure and the drain electrode;
    wherein the second dielectric region has a different material composition as the first dielectric region,
    wherein the first dielectric region comprises aluminum and oxide,
    wherein first dielectric region comprises a first end that faces and is laterally spaced apart from the gate structure, and
    wherein an end surface of the conductive field plate is titled related to a surface of the second dielectric region.

* * * * *

UNITED STATES PATENT AND TRADEMARK OFFICE
CERTIFICATE OF CORRECTION

PATENT NO. : 12,230,700 B2  
APPLICATION NO. : 17/667927  
DATED : February 18, 2025  
INVENTOR(S) : S. Lavanga et al.

Page 1 of 1

It is certified that error appears in the above-identified patent and that said Letters Patent is hereby corrected as shown below:

In the Claims

Column 13, Line 5 Claim 1, change "wherein first" to -- wherein the first --.

Column 13, Line 53 Claim 7, change "wherein first" to -- wherein the first --.

Column 14, Line 54 Claim 12, change "wherein first" to -- wherein the first --.

Signed and Sealed this  
First Day of April, 2025

Coke Morgan Stewart  
*Acting Director of the United States Patent and Trademark Office*